US009721760B2

(12) United States Patent
Dorf et al.

(10) Patent No.: US 9,721,760 B2
(45) Date of Patent: *Aug. 1, 2017

(54) ELECTRON BEAM PLASMA SOURCE WITH REDUCED METAL CONTAMINATION

(71) Applicant: APPLIED MATERIALS, INC., Santa Clara, CA (US)

(72) Inventors: Leonid Dorf, San Jose, CA (US); Shahid Rauf, Pleasanton, CA (US); Kenneth S. Collins, San Jose, CA (US); Kartik Ramaswamy, San Jose, CA (US); Nipun Misra, San Jose, CA (US); Gonzalo Antonio Monroy, San Francisco, CA (US); James D. Carducci, Sunnyvale, CA (US); Steven Lane, Porterville, CA (US)

(73) Assignee: Applied Materials, Inc., Santa Clara, CA (US)

( * ) Notice: Subject to any disclaimer, the term of this patent is extended or adjusted under 35 U.S.C. 154(b) by 766 days.

This patent is subject to a terminal disclaimer.

(21) Appl. No.: 13/912,488

(22) Filed: Jun. 7, 2013

(65) Prior Publication Data

US 2014/0338835 A1   Nov. 20, 2014

Related U.S. Application Data

(60) Provisional application No. 61/824,012, filed on May 16, 2013.

(51) Int. Cl.
*H05H 1/02* (2006.01)
*H01J 37/32* (2006.01)
*H05H 1/50* (2006.01)

(52) U.S. Cl.
CPC ...... *H01J 37/3233* (2013.01); *H01J 37/3266* (2013.01); *H05H 1/50* (2013.01)

(58) Field of Classification Search
CPC ....... H01J 37/295; H01J 37/06; H01J 37/3233
USPC .......................................... 156/345.35, 345.4
See application file for complete search history.

(56) References Cited

U.S. PATENT DOCUMENTS

| 4,684,848 | A | * | 8/1987 | Kaufman | ............... | H01J 37/077 |
| | | | | | | 204/298.36 |
| 5,089,289 | A | * | 2/1992 | Ito | ........................ | C23C 16/486 |
| | | | | | | 136/258 |
| 5,413,663 | A | * | 5/1995 | Shimizu | ............ | H01L 21/67069 |
| | | | | | | 118/719 |
| 5,818,040 | A | * | 10/1998 | Kinoshita | ................ | H05H 3/02 |
| | | | | | | 250/251 |
| 6,094,012 | A | | 7/2000 | Leung | | |
| 6,191,427 | B1 | | 2/2001 | Kase | | |
| 6,426,302 | B2 | | 7/2002 | Kitagawa | | |
| 6,803,705 | B2 | | 10/2004 | Kornfeld | | |
| 6,858,838 | B2 | | 2/2005 | Ichiki | | |
| 6,914,005 | B2 | | 7/2005 | Furuse | | |
| 6,926,799 | B2 | | 8/2005 | Yeom | | |
| 7,078,862 | B2 | | 7/2006 | Fukuda | | |

(Continued)

OTHER PUBLICATIONS

U.S. Appl. No. 14/307,945, filed Jun. 18, 2014, Wu et al.

*Primary Examiner* — Gordon R Baldwin
*Assistant Examiner* — Aiden Lee
(74) *Attorney, Agent, or Firm* — Fish & Richardson P.C.

(57) ABSTRACT

In a plasma reactor for processing a workpiece, an electron beam is employed as the plasma source, and sputtered metal atoms are removed from the electron beam to reduce contamination.

7 Claims, 7 Drawing Sheets

(56) References Cited

U.S. PATENT DOCUMENTS

| | | |
|---|---|---|
| 7,358,484 B2 | 4/2008 | Economou |
| 2002/0157609 A1* | 10/2002 | Miyake ................ C23C 14/221 |
| | | 118/723 VE |
| 2003/0048053 A1 | 3/2003 | Kornfeld |
| 2005/0227502 A1 | 10/2005 | Schmitt |
| 2005/0230834 A1 | 10/2005 | Schmitt |
| 2005/0230934 A1 | 10/2005 | Wilt |
| 2008/0099920 A1 | 5/2008 | Schmitt |
| 2008/0105978 A1 | 5/2008 | Schmitt |
| 2008/0107573 A1 | 5/2008 | Schmitt |
| 2011/0260047 A1 | 10/2011 | Lee |
| 2012/0097870 A1 | 4/2012 | Leray |
| 2012/0258601 A1 | 10/2012 | Holland et al. |
| 2012/0258606 A1 | 10/2012 | Holland et al. |
| 2012/0258607 A1 | 10/2012 | Holland et al. |
| 2014/0035458 A1 | 2/2014 | Wu |
| 2014/0265855 A1 | 9/2014 | Dorf |
| 2014/0339980 A1 | 11/2014 | Wu |
| 2015/0093862 A1 | 4/2015 | Nainani |
| 2016/0042961 A1 | 2/2016 | Dorf et al. |
| 2016/0064231 A1 | 3/2016 | Agarwal et al. |
| 2016/0064244 A1 | 3/2016 | Agarwal et al. |

* cited by examiner

ELECTRON BEAM PLASMA SOURCE WITH REDUCED METAL CONTAMINATION

CROSS-REFERENCE TO RELATED APPLICATIONS

This application claims the benefit of U.S. Provisional Application Ser. No. 61/824,012 filed May 16, 2013 entitled ELECTRON BEAM PLASMA SOURCE WITH REDUCED METAL CONTAMINATION, by Leonid Dorf, et al.

BACKGROUND

Technical Field

The disclosure concerns a plasma reactor for plasma processing of a workpiece, in which the plasma source employs an electron beam.

Background Discussion

A plasma reactor for processing a workpiece can employ an electron beam to generate plasma in a processing chamber. The electron beam source produces a high-energy, sheet electron beam, which is injected into the processing chamber. As the electron beam propagates through the processing chamber, it produces plasma for etching or other applications. A direct-current (dc) electron beam plasma source must include exposed metal surfaces, which provide current continuity required for steady-state operation. Some of these surfaces typically experience bombardment by energetic ions, and may include, for example: (1) the interior surfaces of the electron source discharge chamber, where electrons are generated before being extracted to form the beam; and (2) the surface of the extraction grid facing the processing chamber. In the source discharge chamber, there is a cathode sheath at the surface with a substantial voltage drop (e.g., about 250 eV), in which ions are accelerated towards the metal interior surface. In turn, ions that diffuse into the acceleration gap are picked up by the electric field that accelerates electrons of the beam towards the processing chamber. As a result, these ions are accelerated to significant energies (e.g., on the order of 2 keV) towards the extraction grid. In both the discharge chamber and the acceleration gap, these fast ions bombard the metal surfaces and cause sputtering, so that sputtered metal atoms emerge from the electron beam source and propagate with the electron beam. This leads to metal contamination of the processing chamber walls and the workpiece or substrate being processed. Although the ion energy is much higher in the acceleration gap, the ion flux density is probably much higher in the discharge chamber, so sputtering of metal atoms from the discharge chamber surface can also be substantial. There is a need to prevent the sputtered metal atoms from reaching the processing chamber.

SUMMARY OF THE INVENTION

A plasma reactor for processing a workpiece comprises a processing chamber, a workpiece support in the chamber, a ceiling facing the workpiece support and defining a process zone. The processing chamber comprises an electron beam entrance aligned with an in-chamber beam axis extending through the process zone. The plasma reactor further includes an electron source plasma chamber comprising an electron emission port aligned with a beam emission axis, the beam emission axis being transverse to the in-chamber beam axis. The plasma reactor further includes an electron deflection chamber coupled to the electron emission port and to the electron beam entrance, and a source of a magnetic field, the magnetic field extending into the electron deflection chamber.

In one embodiment, the source of a magnetic field comprises a magnet having a magnetic field direction that is transverse to the beam emission axis and transverse to the in-chamber beam axis. In one embodiment, the magnet comprises a conductive winding wound about an axis that is transverse to the beam emission axis and transverse to the in-chamber beam axis, and a current source coupled to the conductive winding.

In one embodiment, the electron source plasma chamber comprises an acceleration grid adjacent the electron emission port, an extraction grid, an insulating layer between the acceleration grid and the extraction grid, and an acceleration voltage source coupled between the extraction grid and the acceleration grid. In one embodiment, a discharge voltage source is coupled to the electron source plasma chamber.

In one embodiment, the beam emission axis and the in-chamber beam axis are orthogonal to one another.

In one embodiment, the plasma reactor further comprises annular plasma confinement magnets adjacent the processing chamber and having a magnetic field direction generally coinciding with the in-chamber beam axis.

In one embodiment, the strength of the magnetic field and the voltage of the acceleration voltage source are such as to divert electrons along an arcuate path from the beam emission axis to the in-chamber beam axis.

In accordance with a different embodiment, the magnetic field coincides with an arcuate path from the beam emission axis to the in-chamber beam axis. The source of a magnetic field may comprise a first ring magnet aligned with the beam emission axis and a second ring magnet aligned with the in-chamber beam axis. In one embodiment, the first ring magnet is near the electron emission port and the second ring magnet is near the electron beam entrance.

In a related embodiment, the plasma reactor further comprises a source of an electric field coinciding with the arcuate path. In one embodiment, the source of an electric field comprises: (a) an extraction grid coinciding with the electron emission port and aligned with the beam emission axis, (b) an acceleration grid transverse to the extraction grid and coinciding with the electron beam entrance and aligned with the in-chamber beam axis, and (c) an acceleration voltage source connected between the extraction grid and the acceleration grid. The beam emission axis and the in-chamber beam axis may be mutually orthogonal.

In a related embodiment, the plasma reactor further comprises: (a) an inner liner extending from the acceleration grid to the beam entrance of the processing chamber and aligned with the in-chamber beam axis, (b) an outer liner comprising an outer liner portion that is coaxial with the inner liner, and (c) an intermediate liner between the inner liner and the outer liner, and separating the inner liner from the outer liner. In one embodiment, the inner liner is conductive and in electrical contact with a side wall of the processing chamber, the outer liner is conductive and the intermediate liner is an insulator. A further embodiment further includes an insulator layer between the outer liner and the extraction grid.

In a different embodiment, a plasma reactor for processing a workpiece comprises: (a) a processing chamber, a workpiece support in the chamber, a ceiling facing the workpiece support and defining a process zone, the processing chamber comprising an electron beam entrance aligned with an in-chamber beam axis extending through the process zone; (b) an electron source plasma chamber comprising an electron emission port aligned with the in-chamber beam axis;

and (c) a hollow electron drift tube connected between the electron emission port and the electron beam entrance, the electron drift tube being conductive and connected to a voltage attractive to electrons, the drift tube being of length exceeding a width of the drift tube.

BRIEF DESCRIPTION OF THE DRAWINGS

So that the manner in which the exemplary embodiments of the present invention are attained can be understood in detail, a more particular description of the invention summarized above is given by reference to the embodiments thereof which are illustrated in the appended drawings. It is to be appreciated that certain well known processes are not discussed herein in order to not obscure the invention.

Figure 1A:
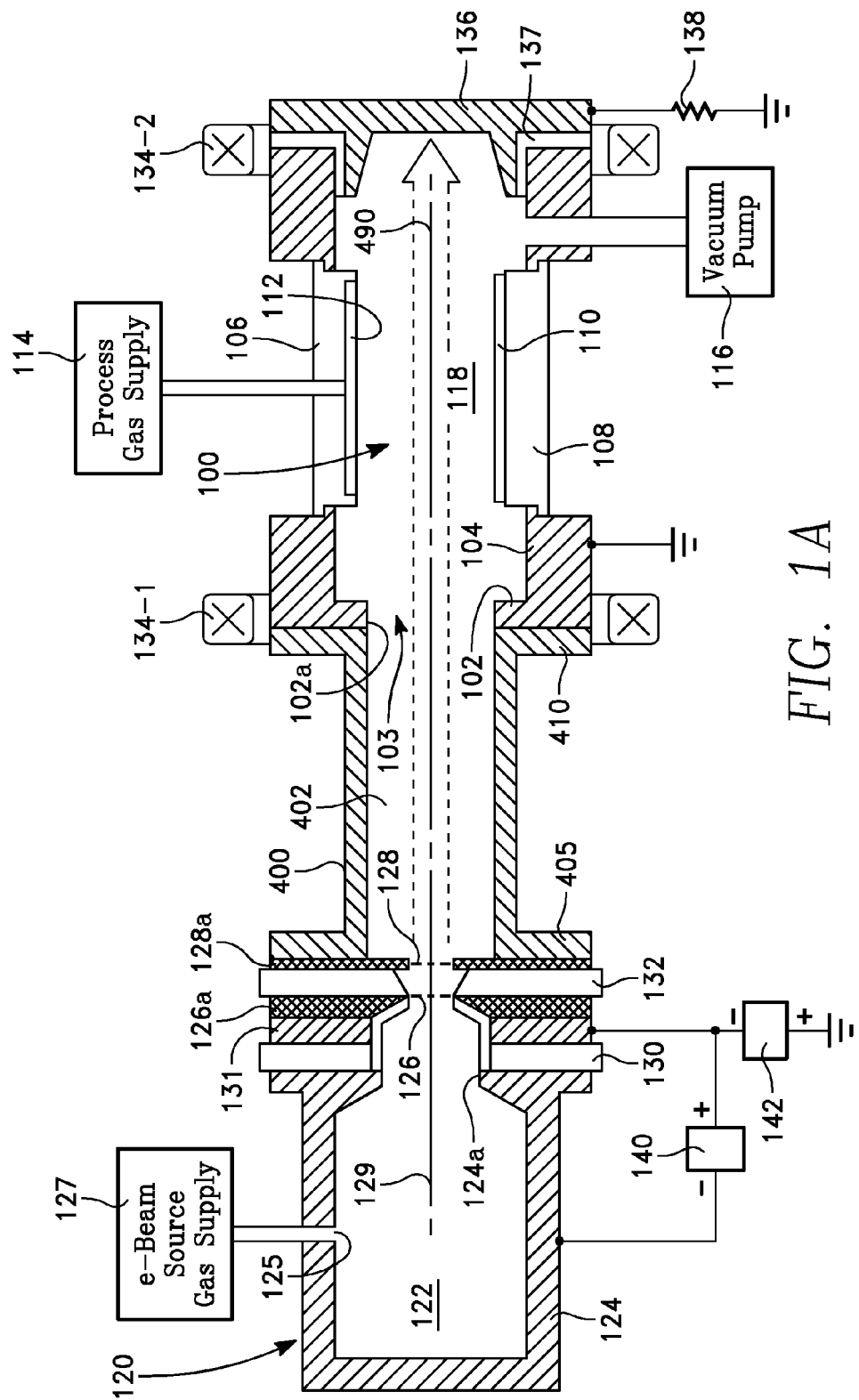
FIG. 1A is a side view of a plasma reactor having an electron beam as a plasma source and having an electron drift tube between the electron beam source and the processing chamber.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 1B:
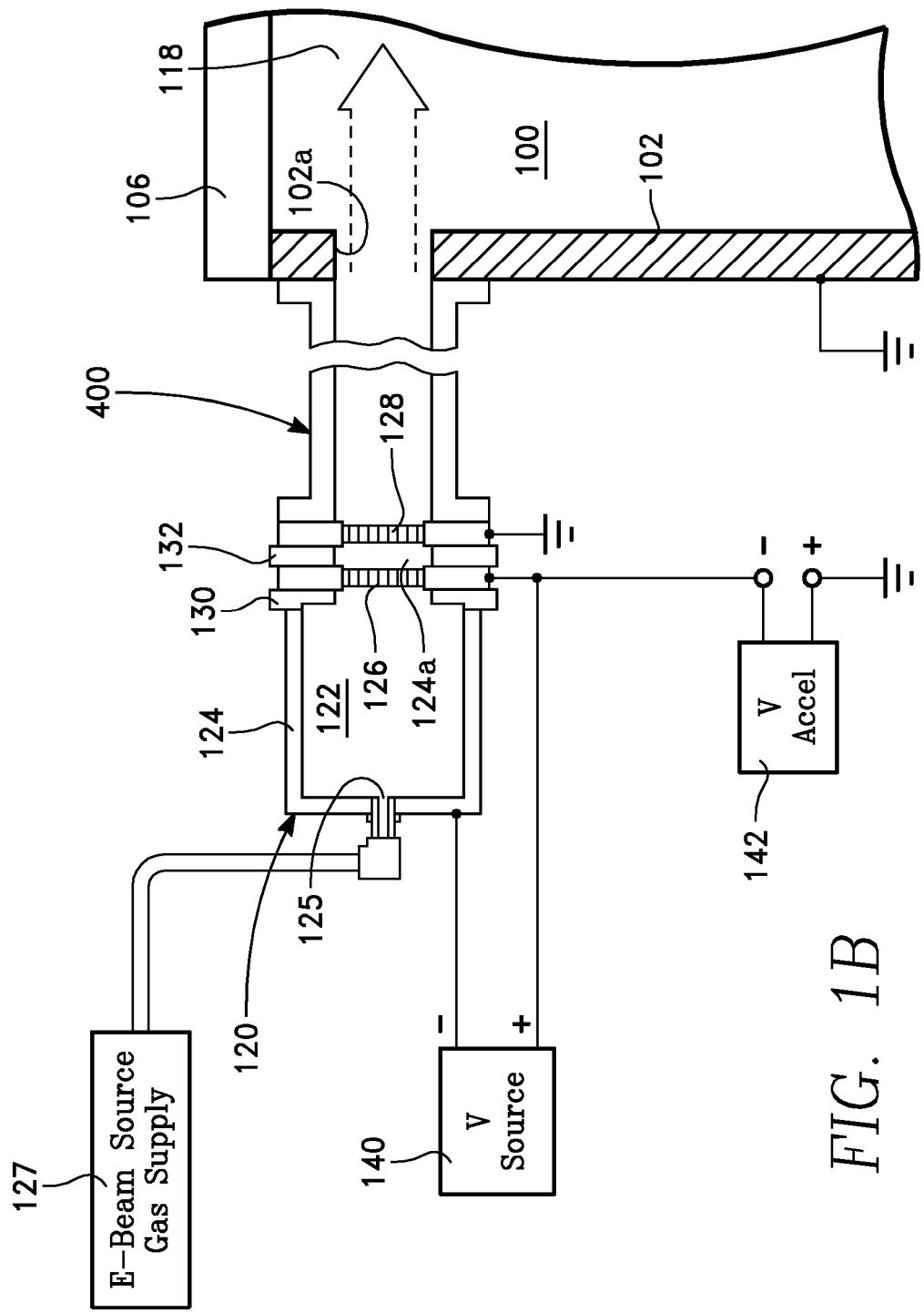
FIG. 1B is an enlarged view of a portion of FIG. 1A.
Figure 1C:
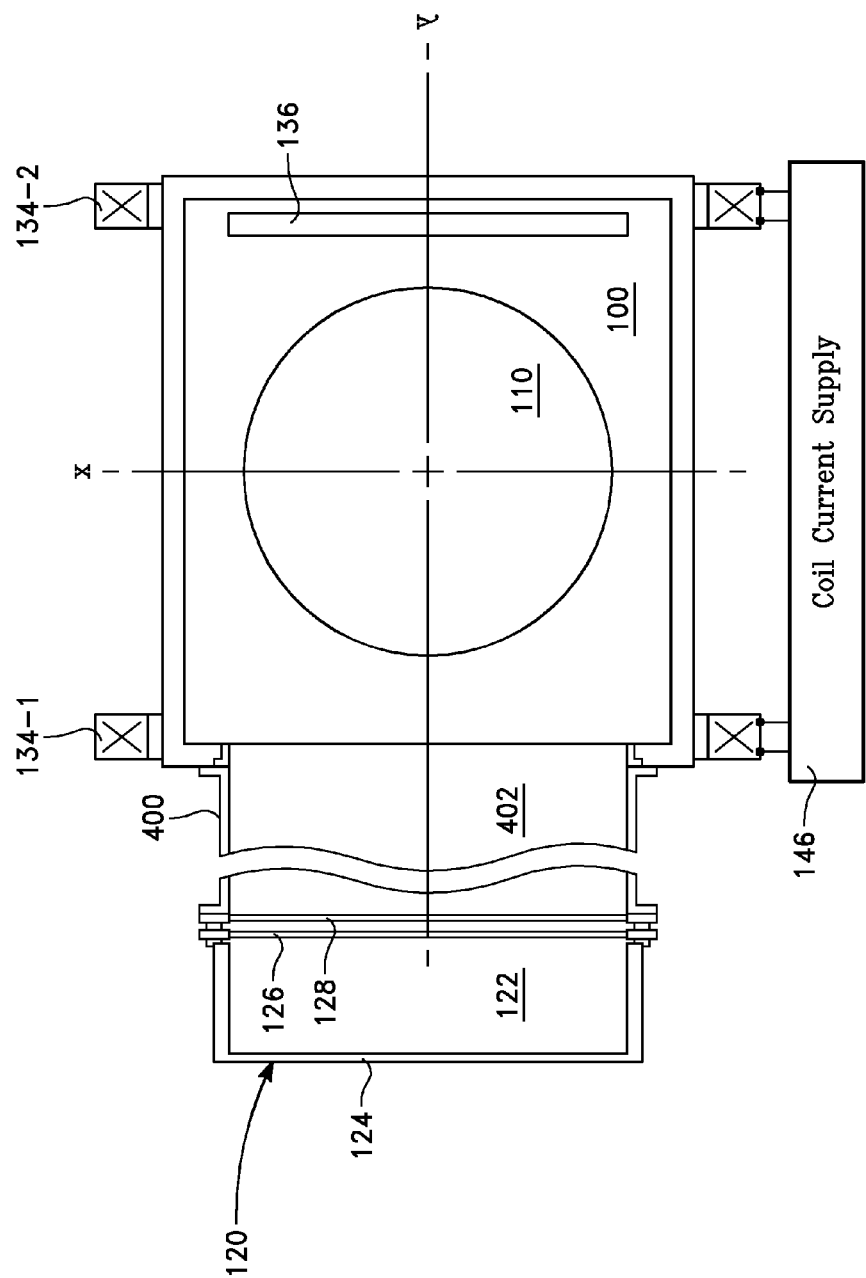
FIG. 1C is a top view of the plasma reactor of FIG. 1A.

Referring to FIGS. 1A-1C, a plasma reactor has an electron beam as a plasma source. The reactor includes a processing chamber 100 enclosed by a cylindrical side wall 102, a floor 104 and a ceiling 106. A workpiece support pedestal 108 supports a workpiece 110, such as a semiconductor wafer, the pedestal 108 being movable in the axial (e.g., vertical) direction. A gas distribution plate 112 is integrated with or mounted on the ceiling 106, and receives process gas from a process gas supply 114. A vacuum pump 116 evacuates the chamber through a passage in the floor 104. A processing region 118 is defined between the workpiece 110 and the gas distribution plate 112. Within the processing region 118, the process gas is ionized to produce a plasma for processing of the workpiece 110.

The plasma is generated in the processing region 118 by an electron beam from an electron beam source 120. The electron beam source 120 includes a plasma generation chamber 122 spaced from the processing chamber 100 and having a conductive enclosure 124. The conductive enclosure 124 has a gas inlet 125. An electron beam source gas supply 127 is coupled to the gas inlet 125. The conductive enclosure 124 has an opening 124a facing the processing region 118 through an opening 102a in the sidewall 102 of the processing chamber 100.

The electron beam source 120 includes an extraction grid 126 adjacent the opening 124a and the plasma generation chamber 122, and an acceleration grid 128 adjacent the extraction grid 126 and facing the processing region 118, best seen in the enlarged view of FIG. 1B. The extraction grid 126 and the acceleration grid 128 may each be formed as either a conductive mesh or a slotted electrode, for example, and are herein referred to generically as grids. Electrical contact to the extraction grid 126 is provided by a conductive ring 126a surrounding the extraction grid. Electrical contact to the acceleration grid 128 is provided by a conductive ring 128a surrounding the acceleration grid 128. The extraction grid 126 and the acceleration grid 128 are mounted with insulators 130, 132, respectively, so as to be electrically insulated from one another and from the conductive enclosure 124. However, the acceleration grid 128 is in electrical contact with the side wall 102 of the chamber 100. The openings 124a and 102a and the extraction and acceleration grids 126, 128 are mutually congruent, generally, and define a thin wide flow path for an electron beam into the processing region 118. The width of the flow path is about the diameter of the workpiece 110 (e.g., 100-400 mm) while the height of the flow path is less than about two inches.

The electron beam source 120 further includes a pair of electromagnets 134-1 and 134-2 adjacent opposite sides of the chamber 100, the electromagnet 134-1 being near the electron beam source 120. The two electromagnets 134-1 and 134-2 produce a magnetic field parallel to the electron beam path. The electron beam flows across the processing region 118 over the workpiece 110, and is absorbed on the opposite side of the processing region 118 by a beam dump 136. The beam dump 136 is a conductive body having a shape adapted to capture the wide thin electron beam. The beam dump 136 may be coupled to ground through a shunt resistor 138.

A negative terminal of a plasma D.C. discharge voltage supply 140 is coupled to the conductive enclosure 124, and a positive terminal of the voltage supply 140 is coupled to the extraction grid 126. In turn, a negative terminal of an electron beam acceleration voltage supply 142 is connected to the extraction grid 126, and a positive terminal of the voltage supply 142 is connected to the ground. In one embodiment the acceleration grid 128 is grounded. The acceleration voltage supply 142 is connected between the extraction grid 126 and the acceleration grid 128. A coil current supply 146 is coupled to the electromagnets 134-1 and 134-2. In one embodiment, plasma is generated within the chamber 122 of the electron beam source 120 by a D.C. gas discharge produced by power from the voltage supply 140. Electrons are extracted from the plasma in the chamber 122 through the extraction grid 126 and the acceleration grid 128 to produce an electron beam that flows into the processing chamber 100. Electrons are accelerated to energies equal to the voltage provided by the acceleration voltage supply 142.

The electron beam source 120 in the embodiment of FIG. 1B has been described as a D.C. gas discharge plasma source. In other embodiments, the electron beam source 120 may embody any other suitable plasma source, such as a capacitively coupled plasma source, an inductively coupled plasma source or a toroidal plasma source.

Figure 1D:
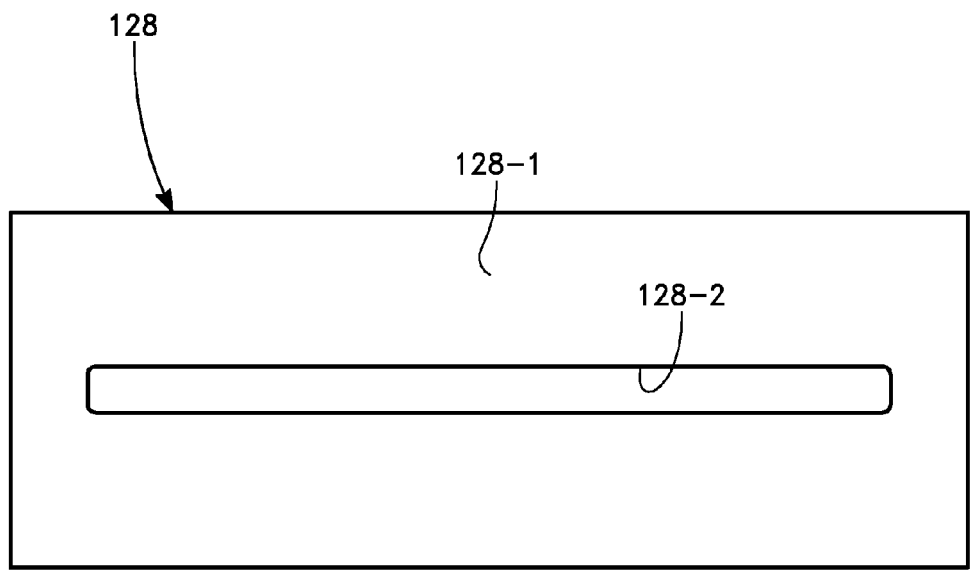
FIG. 1D depicts an acceleration grid in the embodiment of FIG. 1A.

In the embodiment of FIG. 1A, a metallic electron drift tube 400 is disposed between the acceleration grid 128 and the processing chamber 100. In one embodiment, the electron drift tube 400 has a hollow interior 402. In one embodiment, the drift tube 400 has a first flange 405 at one end of the drift tube 400 providing a sealing surface facing the acceleration grid 128. Referring to FIG. 1D, the acceleration grid 128 may be implemented as a metallic plate 128-1 having an elongate slot 128-2, and the drift tube flange 405 contacts portions of the metallic plate 128-1. In one embodiment, the drift tube 400 has a second flange 410 at an opposite end of the drift tube 400 providing a sealing surface facing the cylindrical wall 102 of the chamber 100. The second flange 410 frames the side wall opening 102a defining a beam entrance 103 to the processing chamber 100. The hollow interior 402 of electron drift tube 400 provides a path for the electron beam. Electron flow through the acceleration grid 128 follows a beam emission axis 129 extending through the drift tube 400 and through the processing region 118 of the processing chamber 100 to the beam dump 136. The beam dump 136 may be a metal plate separated from the side wall 102 of the chamber 100 by an insulator 137. As described above, the beam dump 136 may be coupled to ground through a shunt resistor 138.

The axial length of the drift tube 400 is sufficient so that a significant fraction (e.g., 20% to 100%) of sputtered metal atoms emerging with the electron beam through the acceleration grid 128 collide with the interior surface of the drift tube 400, and are thus removed from the electron beam before it enters the processing chamber 100. The axial length of the drift tube 400 may be on the order of the diameter of the workpiece support 108, for example.

A chiller plate 131 may be interposed between the ceramic insulator 130 and the extraction grid 126. The chiller plate 131 may be metallic and include internal coolant flow passages (not illustrated). In one embodiment, the chiller plate 131 contacts with the extraction grid 126, and the acceleration voltage source 142 may be coupled to the extraction grid 126 by connection to the chiller plate 131, as shown in FIG. 1A.

Figure 2C:
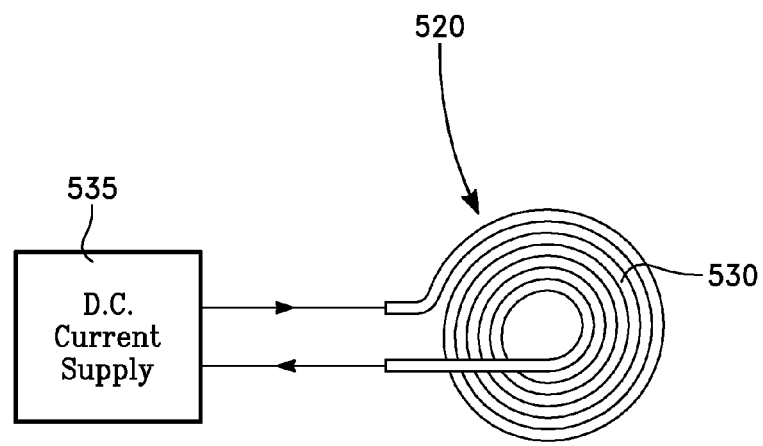
FIG. 2C depicts an electromagnet in the embodiment of FIG. 2A.
Figure 2A:
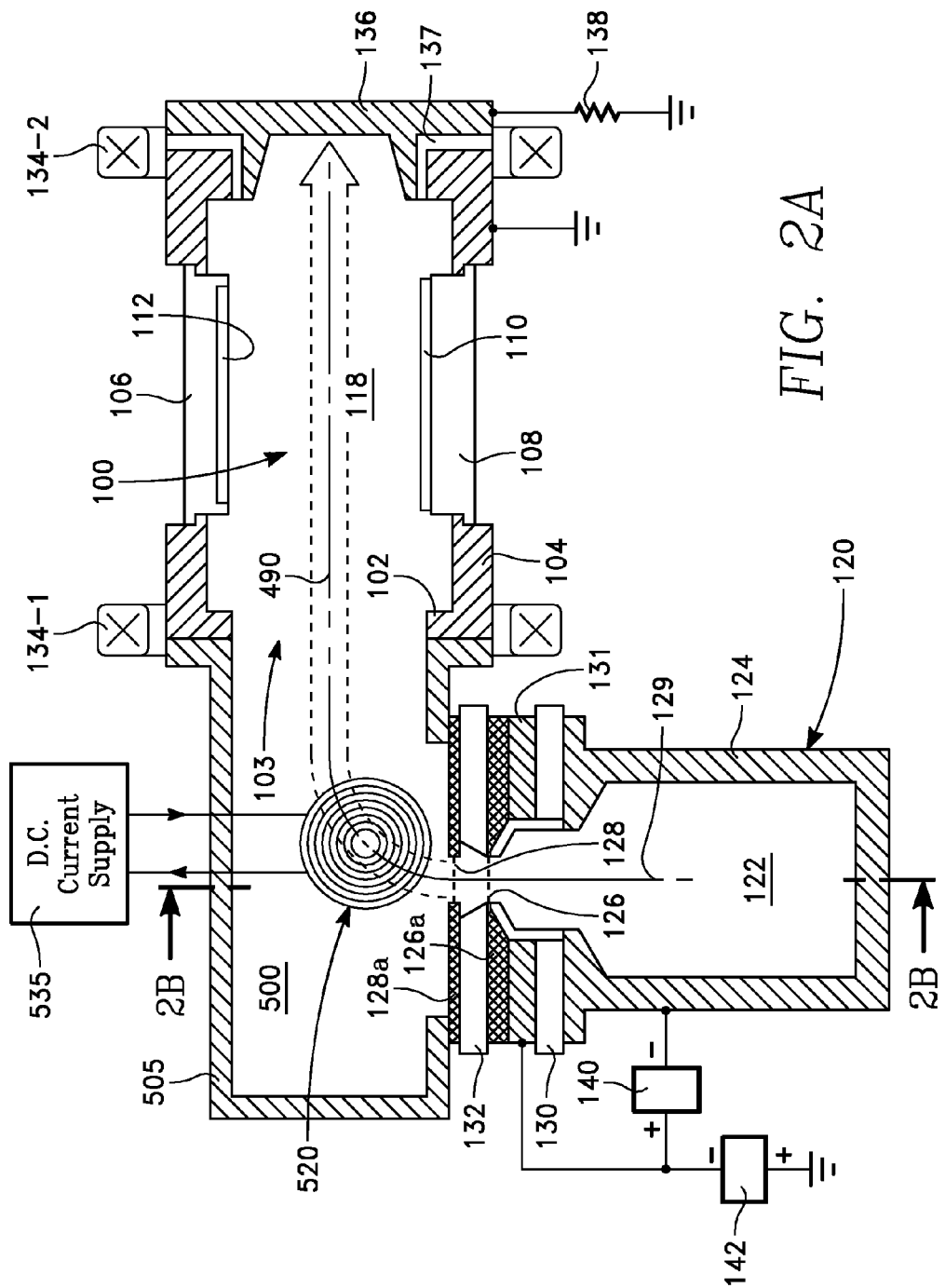
FIG. 2A depicts an embodiment including an electron beam deflection chamber in which the electron beam is deflected by a magnetic field transverse to the electric field.

FIG. 2A illustrates an embodiment in which an electron deflection chamber 500 is interposed between the acceleration grid 128 and the beam entrance 103 to the processing chamber 100. The electron deflection chamber 500 may be enclosed by a wall 505, for example. The acceleration grid 128 is aligned with the beam emission axis 129, while the confinement magnets 134-1, 134-2, the processing chamber 100 and the beam entrance 103 of the processing chamber are aligned with an in-chamber beam axis 490 that is angled with respect to the beam emission axis 129. The angle between the beam emission axis 129 and the in-chamber beam axis 490 may be an acute angle, a right angle or an obtuse angle, for example. The electron beam path turns or is deflected through this angle as it passes through the electron deflection chamber 500. A magnet 520 is provided in the electron deflection chamber 500 to produce this path deflection. The magnet 520 has a magnetic field that is transverse (e.g., perpendicular) to the beam emission axis 129 and transverse (e.g., perpendicular) to the in-chamber beam axis 490. The magnetic field deflects electrons emerging from the acceleration grid 128. Sputtered metal atoms, being neutral, are not deflected and thus do not reach the processing chamber 100. The deflection of the electrons forces them to travel an arcuate path in the electron deflection chamber 500, the radius of the arc being governed by the strength of the magnetic field and the acceleration voltage applied to the extraction grid 126.

Figure 2B:
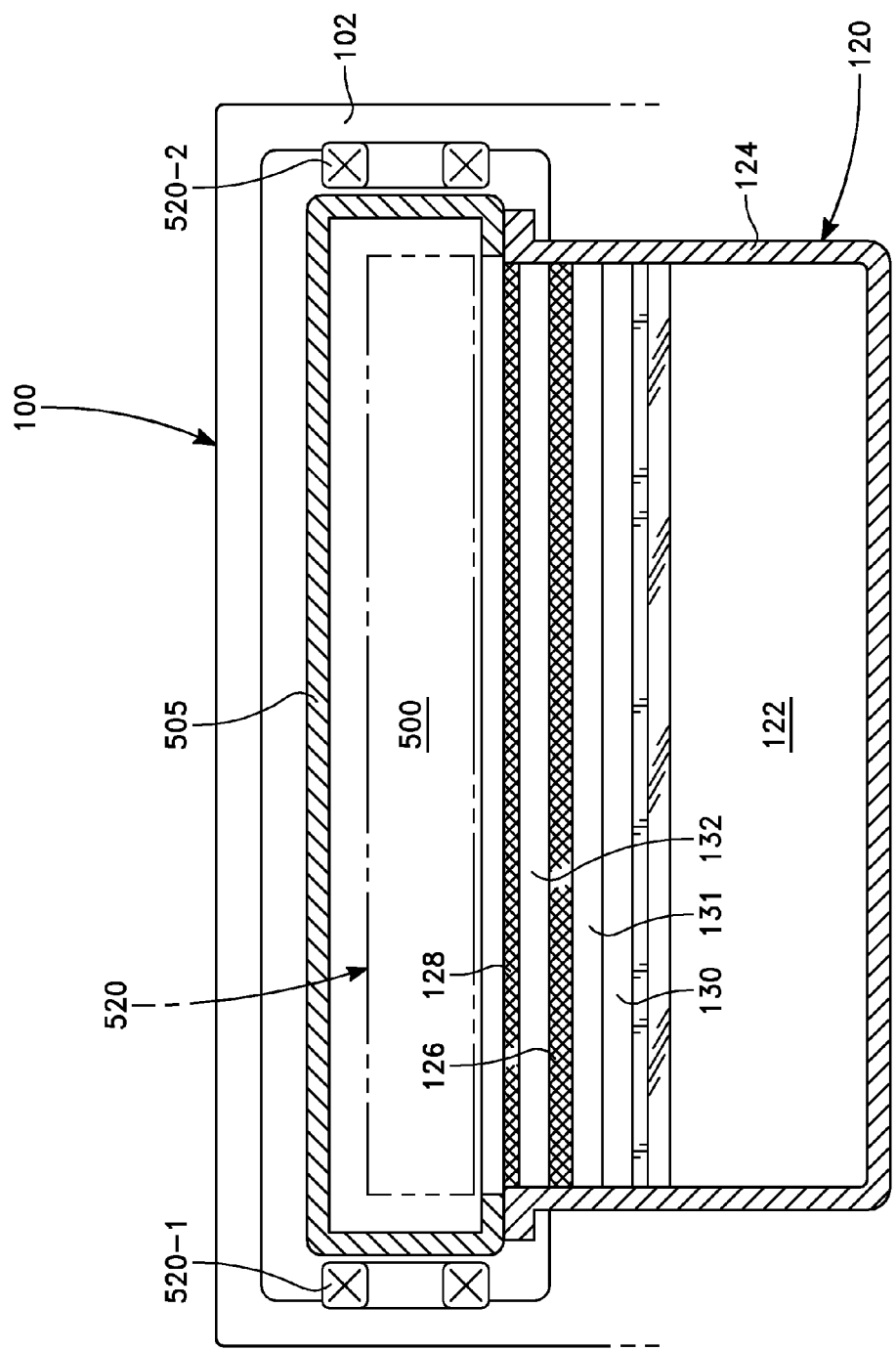
FIG. 2B is an end view corresponding to FIG. 2A.

In one embodiment depicted in FIG. 2B, the magnet 520 consists of two external magnets 520-1 and 520-2 disposed on opposite sides of the deflection chamber 500. In one embodiment, each magnet 520 is an electromagnet having a conductive winding 530, as depicted in FIG. 2C. The conductive winding 530 has an axis transverse (e.g., perpendicular) to the beam emission axis 129 and transverse (e.g., perpendicular) to the in-chamber beam axis 490, in accordance with FIG. 2A. A current source 535 supplies electric current to the winding 530. The current from the current source 535 is adjusted together with the acceleration voltage applied to the extraction grid 126 so that the electron path follows an arc linking the beam emission axis 129 and the in-chamber beam axis 490 in the manner depicted in FIG. 2A. While FIG. 2A depicts an embodiment in which the beam emission and in-chamber beam axes 129, 490 are orthogonal to one another, in other embodiments they may be oriented at an acute or an obtuse angle, and the acceleration voltage and the magnet current are adjusted to provide the desired electron beam path.

Figure 3:
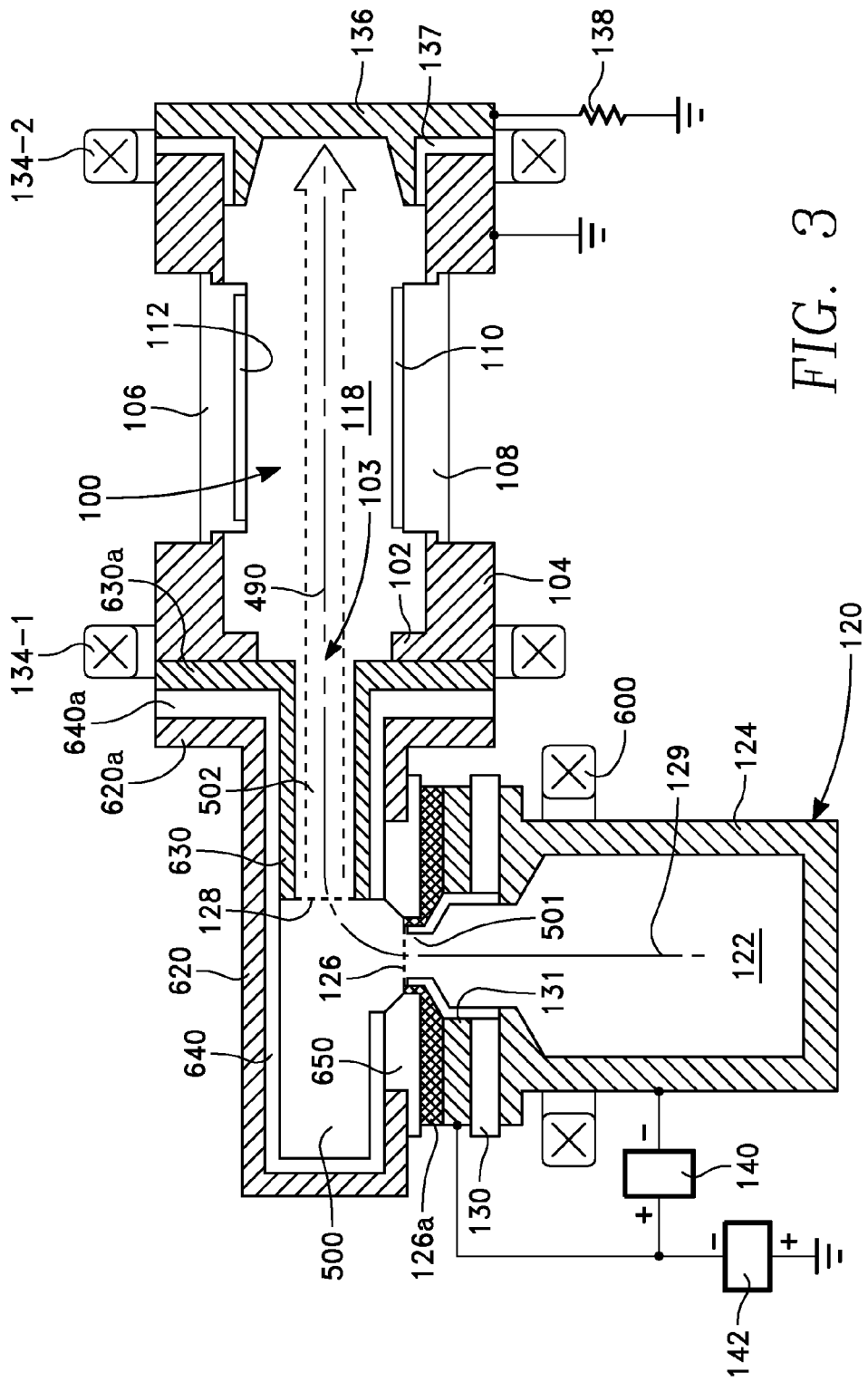
FIG. 3 depicts an embodiment including an electron beam deflection chamber in which the electron beam is deflected by electric and magnetic fields that are generally parallel to one another.

FIG. 3 illustrates an embodiment in which the electric and magnetic fields are generally parallel to one another and follow the arcuate path lying between the beam emission axis 129 and the in-chamber beam axis 490. The embodiment of FIG. 3 is a modification of the embodiment of FIG. 2A, but without the magnet 520-1 or 520-2. In the embodiment of FIG. 3, the electron deflection chamber 500 has an electron beam entrance 501 adjacent the extraction grid 126 and aligned with the beam emission axis 129, and an electron beam exit 502 aligned with the in-chamber beam axis 490. The acceleration grid 128 is adjacent the electron beam exit 502 and lies in a plane transverse (e.g., perpendicular) to the plane of the extraction grid 126. In one embodiment, the mutually transverse (or perpendicular) orientation of the extraction and acceleration grids 126, 128 provides an arcuate electric field coinciding with arcuate path between the beam emission axis 129 and the in-chamber beam axis 490.

An external beam confinement magnet 600 surrounds the plasma generation chamber 122 and has a magnetic field direction coinciding with the beam emission axis 129. It should be noted that the plasma confinement magnets 134-1 and 134-2 surrounding the processing chamber 100 have a magnetic field direction coinciding with the in-chamber beam axis 490. The two beam confinement magnets 600 and 134-1 have magnetic field directions transverse (e.g., perpendicular) to one another. In one embodiment, the beam confinement magnets 600 and 134-1 of FIG. 3 produce within the electron deflection chamber 500 an arcuate magnetic field that follows an arcuate path between the beam emission axis 129 and the in-chamber beam axis 490. In one embodiment, the arcuate magnetic field is at least generally parallel with the arcuate electric field produced by the mutually transverse extraction and acceleration grids 126, 128.

The arcuate magnetic and electric fields in the electron deflection chamber 500 of FIG. 3 deflect the electron beam emerging from the extraction grid 128. Sputtered metal atoms emerging with the electron beam, being neutral, are not deflected and thus do not reach the processing chamber 100.

The wall 505 of the electron beam deflection chamber in one embodiment includes an outer liner 620 aligned with the in-chamber beam axis 490 and having a flange 620a spaced from and facing the side wall 102 of the processing chamber 100. An inner liner 630 within the outer liner 620 extends from the acceleration grid 128 toward the processing chamber 100 and has a flange 630a facing and contacting the side wall 102 of the processing chamber 100. An intermediate liner 640 covers the interior surface of the outer liner 620 and has a flange 640a pressed between the flanges 620a and 630a. An insulator 650 electrically separates the outer liner 620 from the extraction grid 126.

In one embodiment, the inner liner 630 is grounded by contact of the flange 620a with the chamber side wall 102. The acceleration grid 128 is grounded through contact with the inner liner 630. The intermediate liner 640 is an insulator and electrically isolates the outer and inner liners 620, 630 from one another. The electrical potential of the outer liner 620 may be a floating potential, for example.

While the foregoing is directed to embodiments of the present invention, other and further embodiments of the invention may be devised without departing from the basic scope thereof, and the scope thereof is determined by the claims that follow.

What is claimed is:

1. A plasma reactor for processing a workpiece, comprising:
    a processing chamber, a workpiece support in said chamber, a ceiling facing said workpiece support and defining a process zone, said processing chamber comprising an electron beam entrance aligned with an in-chamber beam axis extending through said process zone, said in-chamber beam axis being parallel with a support plane of said workpiece support;
    an electron source plasma chamber comprising an electron extraction grid and an electron emission port aligned with a beam emission axis, said beam emission axis being transverse to said in-chamber beam axis;
    an electron deflection chamber comprising a first port coupled to said electron emission port and a second port coupled to said electron beam entrance, and a source of a magnetic field, said magnetic field extending into said electron deflection chamber, wherein said source of said magnetic field comprises magnets disposed on opposite sides of said electron deflection chamber such that central axes of said magnets coincide with each other, and configured to generate a magnetic field direction that is transverse to said beam emission axis and transverse to said in-chamber beam axis; and
    annular plasma confinement magnets having a magnetic field direction generally coinciding with said in-chamber beam axis.

2. The plasma reactor of claim 1 wherein said magnets disposed on opposite sides of said electron deflection chamber comprise a conductive winding wound about an axis that is transverse to said beam emission axis and transverse to said in-chamber beam axis, and a current source coupled to said conductive winding.

3. The plasma reactor of claim 1 wherein said electron source plasma chamber comprises an acceleration grid facing said electron emission port, an insulating layer between said acceleration grid and said extraction grid, and an acceleration voltage source electrically coupled between said electron extraction grid and said acceleration grid.

4. The plasma reactor of claim 3 further comprising a discharge voltage source coupled to said electron source plasma chamber.

5. The plasma reactor of claim 1 wherein said beam emission axis and said in-chamber beam axis are orthogonal to one another.

6. The plasma reactor of claim 3 wherein a strength of said magnetic field and a voltage of said acceleration voltage source are such as to divert electrons along an arcuate path from said beam emission axis to said in-chamber beam axis.

7. The plasma reactor of claim 1 wherein said magnetic field coincides with an arcuate path from said beam emission axis to said in-chamber beam axis.

* * * * *